(12) United States Patent
Hirler et al.

(10) Patent No.: US 9,142,665 B2
(45) Date of Patent: Sep. 22, 2015

(54) SEMICONDUCTOR COMPONENT WITH A SEMICONDUCTOR VIA

(75) Inventors: Franz Hirler, Isen (DE); Andreas Peter Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 1199 days.

(21) Appl. No.: 12/964,865

(22) Filed: Dec. 10, 2010

(65) Prior Publication Data

US 2012/0146130 A1 Jun. 14, 2012

(51) Int. Cl.

| | | |
|---|---|---|
| H01L 29/66 | (2006.01) | |
| H01L 29/78 | (2006.01) | |
| H01L 21/768 | (2006.01) | |
| H01L 21/8234 | (2006.01) | |
| H01L 23/48 | (2006.01) | |
| H01L 23/00 | (2006.01) | |
| H01L 27/088 | (2006.01) | |
| H01L 29/06 | (2006.01) | |

(Continued)

(52) U.S. Cl.
CPC ...... *H01L 29/7813* (2013.01); *H01L 21/76898* (2013.01); *H01L 21/823481* (2013.01); *H01L 23/481* (2013.01); *H01L 24/05* (2013.01); *H01L 27/088* (2013.01); *H01L 29/0653* (2013.01); *H01L 29/42372* (2013.01); *H01L 29/7397* (2013.01); *H01L 29/7811* (2013.01); H01L 29/66734 (2013.01); H01L 2924/01005 (2013.01); H01L 2924/01006 (2013.01); H01L 2924/01013 (2013.01); H01L 2924/01019 (2013.01); H01L 2924/01029 (2013.01); H01L 2924/01033 (2013.01); H01L 2924/01074 (2013.01); H01L 2924/10329 (2013.01); H01L 2924/13055 (2013.01); H01L 2924/13091 (2013.01)

(58) Field of Classification Search
CPC ............... H01L 29/0653; H01L 29/42372; H01L 29/7397; H01L 29/7811; H01L 29/7813
USPC ............... 257/329, E23.262, E21.41, E21.54, 257/E2.262, E21.549; 438/268, 424, 430, 438/435
See application file for complete search history.

(56) References Cited

U.S. PATENT DOCUMENTS

| | | |
|---|---|---|
| 6,836,020 B2 | 12/2004 | Cheng |
| 7,276,787 B2 | 10/2007 | Edelstein et al. |
| 7,459,365 B2 | 12/2008 | Rüb et al. |

(Continued)

FOREIGN PATENT DOCUMENTS

| | | |
|---|---|---|
| WO | 04001854 A2 | 12/2003 |

*Primary Examiner* — Colleen A Matthews
*Assistant Examiner* — Colleen E Snow
(74) *Attorney, Agent, or Firm* — Murphy, Bilak & Homiller, PLLC

(57) ABSTRACT

A method for producing a semiconductor component includes providing a semiconductor body with a first surface and a second surface opposite the first surface, forming an insulation trench which extends into the semiconductor body from the first surface and which in a horizontal plane of the semiconductor body has a geometry such that the insulation trench defines a via region of the semiconductor body, forming a first insulation layer on one or more sidewalls of the insulation trench, removing semiconductor material of the semiconductor body from the second surface to expose at least parts of the first insulation layer, to remove at least parts of the first insulation layer, or to leave at least partially a semiconductor layer with a thickness of less than 1 μm between the first insulation layer and the second surface, and forming first and second contact electrodes on the via region.

17 Claims, 11 Drawing Sheets

(51) Int. Cl.
*H01L 29/423* (2006.01)
*H01L 29/739* (2006.01)

(56) References Cited

U.S. PATENT DOCUMENTS

| | | | |
|---|---|---|---|
| 8,138,036 B2 * | 3/2012 | Andry et al. | 438/199 |
| 8,384,224 B2 * | 2/2013 | Ding et al. | 257/774 |
| 2006/0172494 A1 | 8/2006 | Kohlmann-Von Platen | |
| 2006/0214298 A1 | 9/2006 | Huang et al. | |
| 2007/0048896 A1 | 3/2007 | Andry et al. | |
| 2008/0012119 A1 * | 1/2008 | Otremba et al. | 257/698 |
| 2008/0079131 A1 | 4/2008 | Kim et al. | |
| 2008/0135932 A1 | 6/2008 | Ozeki | |
| 2009/0032865 A1 | 2/2009 | Hirler | |
| 2009/0195855 A1 | 8/2009 | Steyn et al. | |
| 2009/0322417 A1 | 12/2009 | Hirler | |

* cited by examiner

SEMICONDUCTOR COMPONENT WITH A SEMICONDUCTOR VIA

TECHNICAL FIELD

Embodiments of the present invention relate to a method for producing a semiconductor component with an electrically conductive via extending through a semiconductor body, and to a semiconductor component with a via.

BACKGROUND

There are semiconductor components or devices which include at least a part of their device structure in the region of a first surface of a semiconductor body and which include a terminal for electrically contacting the device structure at a second surface of the semiconductor body. Such components further include an electrically conducting via which extends through the semiconductor body from the terminal at the second surface to the first surface.

The electrically conducting via is usually electrically insulated from surrounding regions of the semiconductor body. A via like this can be produced by: forming a trench, depositing an electrically insulating material at the sidewalls of the trench, and filling the remaining trench with an electrically conductive material.

There is a need to provide a method for producing a semiconductor component with an electrically conductive via extending through a semiconductor body which is properly insulated from surrounding regions of the semiconductor body.

SUMMARY

According to an embodiment of a method for producing a semiconductor component, the method includes: providing a semiconductor body with a first surface and a second surface opposite the first surface; forming an insulation trench which extends into the semiconductor body from the first surface and which in a horizontal plane of the semiconductor body defines a via region of the semiconductor body; forming a first insulation layer on one or more sidewalls of the insulation trench; removing semiconductor material of the semiconductor body from the second surface to expose at least parts of the first insulation layer, to remove at least parts of the first insulation layer, or to leave at least partially a semiconductor layer with a thickness of less than 1 m between the first insulation layer and the second surface; forming a first contact electrode on the via region in the region of the first surface; and forming a second contact electrode on the via region in the region of the second surface.

According to an embodiment of a semiconductor component, the component includes: a semiconductor body with a first surface and a second surface; a first contact electrode in a region of the first surface; a second contact electrode in a region of the second surface; a semiconductor via region extending between the first and second contact electrodes; and an insulation layer separating the via region in a horizontal direction of the semiconductor body from other regions of the semiconductor body.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1 which includes

FIG. 5 which includes

FIG. 7 which includes

DETAILED DESCRIPTION

FIGS. 1A to 1H illustrate a first embodiment of a method for producing a semiconductor component with an electrically conductive via extending through a semiconductor body. These figures show vertical cross-sections through a semiconductor body during or after particular method steps.

Figure 1A:
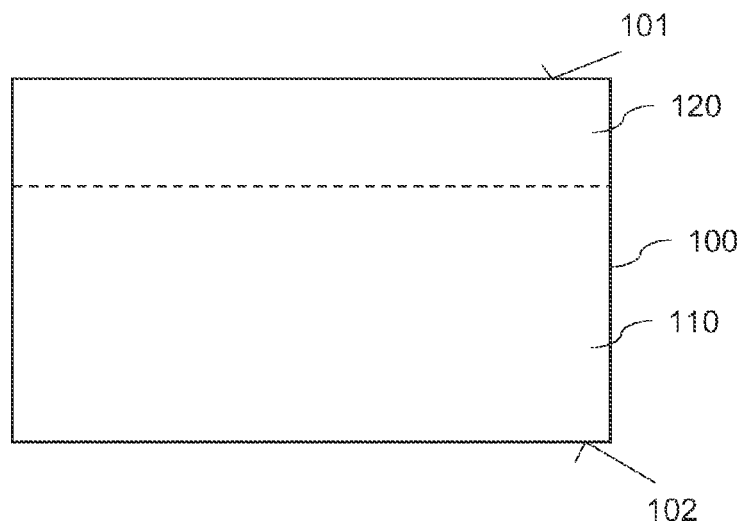
FIGS. 1A to 1H, illustrates vertical cross sections through a semiconductor body during a method according to a first embodiment for producing a semiconductor component with a semiconductor via.

Referring to FIG. 1A, the semiconductor body 100 is provided. The semiconductor body 100 includes a first surface 101 and a second surface 102 opposite the first surface 101. The vertical cross-sections illustrated in FIGS. 1A to 1H are cross-sections in a vertical section plane which is perpendicular to the first and second surfaces 101, 102.

The semiconductor body 100 can comprise a conventional semiconductor material, e.g. silicon (Si), silicon carbide (SiC), gallium arsenide (GaAs), gallium nitride (GaN), etc. The semiconductor body 100 is, in particular, a monocrystalline semiconductor body.

According to a first embodiment, the semiconductor body 100 has a homogeneous basic doping. Dependent on the specific type of the semiconductor component which is to be implemented, the basic doping can be an n-doping or a p-doping. According to a further embodiment, the semiconductor body 100 includes two differently doped semiconductor layers: a first semiconductor layer 110; and a second semiconductor layer 120 on top of the first semiconductor layer 110. The first semiconductor layer 110 is, for example, a semiconductor substrate, and the second semiconductor layer 120 is, for example, an epitaxial layer grown on the substrate 110. The two semiconductor layers 110, 120 can have different doping concentrations and/or doping types. According to one embodiment, the first layer 110 has a higher doping concentration than the second layer 120. The doping concentration of the first layer 110 is, for example, in the range of between $10^{18}$ cm$^{-3}$ and $10^{21}$ cm$^{-3}$ while the doping concentration of the second layer 120 is, for example, in the range of between $10^{14}$ cm$^{-3}$ and $10^{17}$ cm$^{-3}$. The doping types of the dopings of the first and second layers 110, 120 can be identical or can be complementary.

Figure 1B:
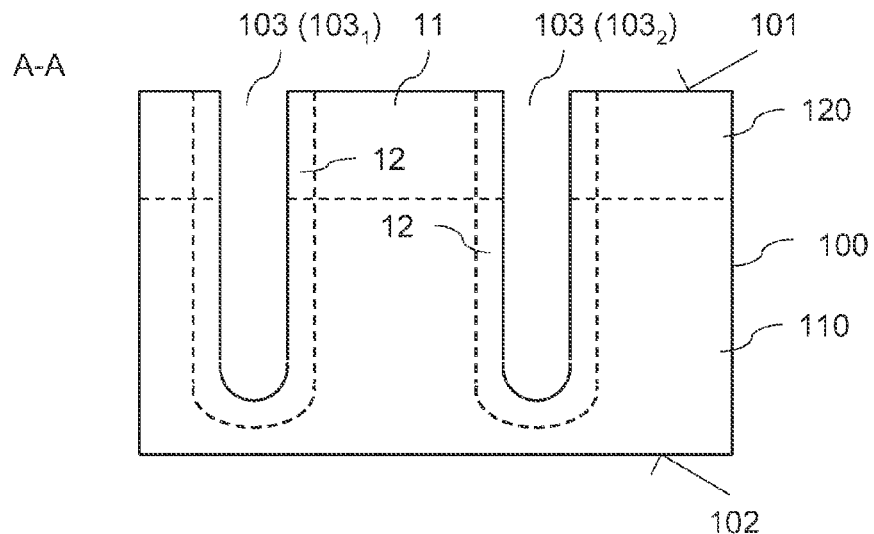

Referring to FIG. 1B, at least one insulation trench is formed which extends into the semiconductor body 100 from the first surface 101. In a horizontal plane of the semiconductor body 100, the at least one insulation trench 103 forms a closed loop or ring such that the at least one insulation trench 103 encloses a region 11 of the semiconductor body 100. The region 11 enclosed by the insulation trench 103 in the horizontal direction of the semiconductor body 100 will be referred to as a via region in the following. In the horizontal plane, the insulation trench 103 can be implemented in many different ways, i.e. with many different geometries. For illustration purposes, some examples will be explained with reference to embodiments illustrated in FIGS. 2 to 4.

Figures 2, 3:
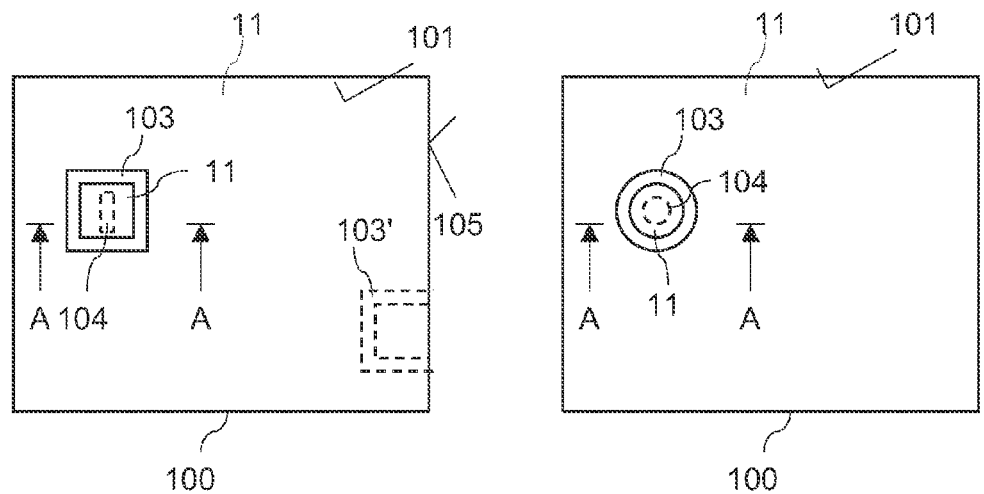
FIG. 2 illustrates a horizontal cross section through a semiconductor body which includes a rectangular semiconductor via region.
FIG. 3 illustrates a horizontal cross section through a semiconductor body which includes a circular semiconductor via region.

FIG. 2 shows a top view on the semiconductor body 100 after forming the insulation trench 103. In the embodiment illustrated in FIG. 2, the insulation trench 103 has a rectangular geometry. In this case, the insulation trench 103 is implemented as a rectangular ring or loop in a horizontal plane of the semiconductor body 100. Consequently, the semiconductor via region 11 enclosed by the insulation trench 103 is rectangular in the horizontal plane.

In the embodiment illustrated in FIG. 3, the insulation trench 103 has an ellipsoidal and, specifically, a circular geometry. Consequently, the semiconductor via region 11 enclosed by the insulation trench 103 has an ellipsoidal and, specifically, a circular geometry.

In the embodiments illustrated in FIGS. 2 and 3 the semiconductor via region 11 is defined by one insulation trench 103 which encloses the semiconductor via region 11. However, an insulation trench 103 with a rectangular geometry (see FIG. 2) or an ellipsoidal geometry (see FIG. 3) are only exemplary embodiments. The insulation trench 103 can have any other geometry, provided that the insulation trench 103 forms a closed loop or ring enclosing the semiconductor via region 11.

Figure 4:
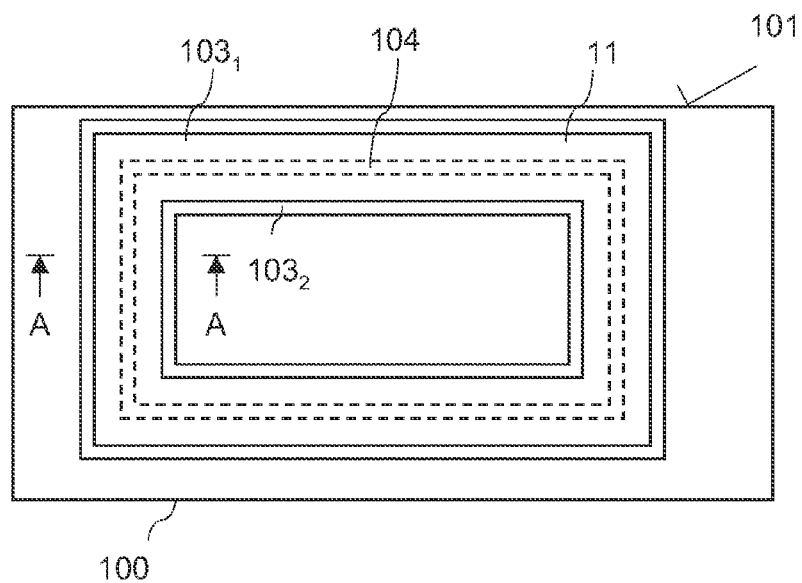
FIG. 4 illustrates a horizontal cross section through a semiconductor body which includes a ring-shaped semiconductor via region.

According to a further embodiment which is illustrated in FIG. 4, the semiconductor via region 11 is enclosed by two insulation trenches each of which forms a closed loop: a first insulation trench $103_1$, and a second insulation trench $103_2$ arranged within the loop defined by the first trench $103_1$. The first and the second trenches $103_1$, $103_2$ are spaced apart from one another so that the semiconductor via region 11 is disposed between the two trenches $103_1$, $103_2$. In the embodiment illustrated in FIG. 4, the first and second trenches $103_1$, $103_2$ basically have a rectangular geometry. However, this is only an example. These two trenches $103_1$, $103_2$ may have any other closed-loop geometry other than a rectangular geometry as well.

In the embodiments illustrated in FIGS. 2, 3 and 4, the trench 103 (in the horizontal plane) forms a closed loop which surrounds a semiconductor region, wherein the semiconductor region surrounded by the trench forms the via region 11. The trench with the closed-loop geometry separates the via region 11 in the horizontal direction from other regions of the semiconductor body 100. However, it is not necessary for the trench 103 to have a closed-loop geometry in order to define the via region 11. If, for example, the trench 103 is arranged close to an edge of the semiconductor body 100 and terminates at the edge of the semiconductor body 100, a closed-loop geometry is not required. This is illustrated in dashed lines in FIG. 2. In this Figure, reference numeral 105 denotes an edge of the semiconductor body 100 at which the semiconductor body 100 terminates.

A trench 103' (illustrated in dashed lines) terminates at the edge 105 and forms a closed loop with the edge so that the trench (together with the edge 105 of the semiconductor body) defines the via region 11. In this connection it should be noted that usually a plurality of semiconductor bodies which are part of a semiconductor wafer (not shown) are processed together, and the wafer is separated to form the individual semiconductor bodies at the end of such processing. Thus, when the trenches 103 or 103', respectively, are formed, the wafer has not yet been separated. At this time, lines (scribe lines) on the wafer define where the wafer is to be separated and, therefore, define where the edges of the individual wafers will be. At this time of processing, the trench 103' and the scribe line define the via region 11. The trench 103' can also be formed with a closed-loop geometry such that the trench 103' extends into the scribe line. In this case, the closed loop defined by this trench 103' is "opened" when the wafer is cut into the individual semiconductor bodies (dies) by cutting along the scribe lines.

In the embodiments drawn in solid lines of FIGS. 2 and 3 the trenches 103 define a silicon via 11 which is enclosed by the trench. Outside the closed-loop defined by the trench active component region, like active regions of a transistor can be arranged. In the embodiments of FIGS. 2 and 3, the area of the semiconductor body 100 enclosed by the trench is selected such that a via with a suitable/desired ohmic resistance is obtained. According to a further embodiment, active component regions are arranged in the semiconductor area enclosed by the trench 103 and the via is defined by the trench and the edge 105 of the semiconductor body 100. In this case, the via 11 (as shown in dotted lines in FIGS. 2 and 3) is arranged between the edge 105 and the trench 103 and forms a closed loop which encloses the trench 103, with the trench 103 forming a closed loop that encloses the active regions, like e.g., a field of transistor cells.

FIG. 1B represents a vertical cross-section through each of the embodiments illustrated in FIGS. 2, 3 and 4. In FIG. 1B, the reference signs in parentheses represent the reference signs for the embodiment according to FIG. 4. In the following "at least one insulation trench" means either one trench 103 as illustrated in FIGS. 2 and 3, or two trenches $103_1$, $103_2$ as illustrated in FIG. 4.

The at least one insulation trench 103, which extends in a vertical direction of the semiconductor body 100, can be produced using an etching method. Etching methods for producing a vertical trench in a semiconductor body are commonly known, so that no further explanation is required in this regard. "To extend in a vertical direction" means that the at least one trench 103 generally extends in the vertical direction. However, the trench can also be inclined relative to the first surface 101, so that an angle between sidewalls of the trench 103 and the first surface 101 can be different from 90°. The trench width can decrease or can increase with depth. Both sidewalls can also be tilted toward the same direction with the trench width being e.g. constant over the trench depth. The direction in which the trenches 103 are tilted can, for example, vary over the wafer.

The at least one insulation trench 103 is produced such that it does not completely extend through the semiconductor body 100 to the second surface 102. A depth of the insulation trench 103 is, for example, in the range of between 5 µm and 200 µm, in particular between 30 µm and 60 µm, like about 50 µm. A width of the trench is, for example, in the range of between 200 nm and 20 µm.

Figure 1C:
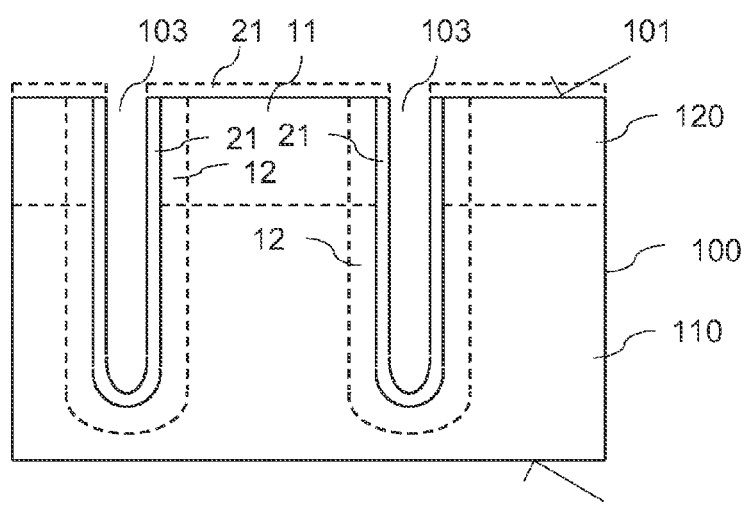

Referring to FIG. 1C, a first insulation layer 21 is formed at least on the sidewalls of the at least one insulation trench 103. In the embodiment illustrated in FIG. 1C, the first insulation layer 21 is formed on the sidewalls and on the bottom of the at least one insulation trench 103. The first insulation layer 21 is, for example, an oxide layer. The oxide layer can be produced by a thermal oxidation process and/or by a deposition process. The method, however, is not restricted to the use of an oxide as the insulation layer 21. Any other type of insulation or dielectric material may be used as well, like a nitride, aluminum oxide ($Al_2O_3$) or a low-k-dielectric. According to one embodiment, the first insulation layer 21 is a composite layer which includes two or more layers of an insulation material arranged one above the other.

Optionally, a doped semiconductor region 12 (illustrated in dashed lines) is produced in the semiconductor body 100 adjacent the insulation trench 103. The doped semiconductor region 12 has a higher doping concentration than the basic doping of the semiconductor body 100 or, when the semiconductor body 100 includes a higher doped first layer 110 and a lower doped second layer 120, has a doping concentration which is at least higher than the doping concentration of the lower doped semiconductor layer 120. The doped semiconductor region 12 is produced adjacent to the trench 103 at least in the via region 11, but can also be produced along the complete side walls and the bottom of the insulation trench 103. Forming the higher doped region 12 includes, for example: a deposition process, in which a doped glass or doped polysilicon is deposited, followed by a diffusion process; a gas phase doping process; or an implantation and/or diffusion process in which dopant atoms are implanted or diffused via the sidewalls (and optionally the bottom) of the insulation trench 103 into the semiconductor body 100.

Figure 1D:
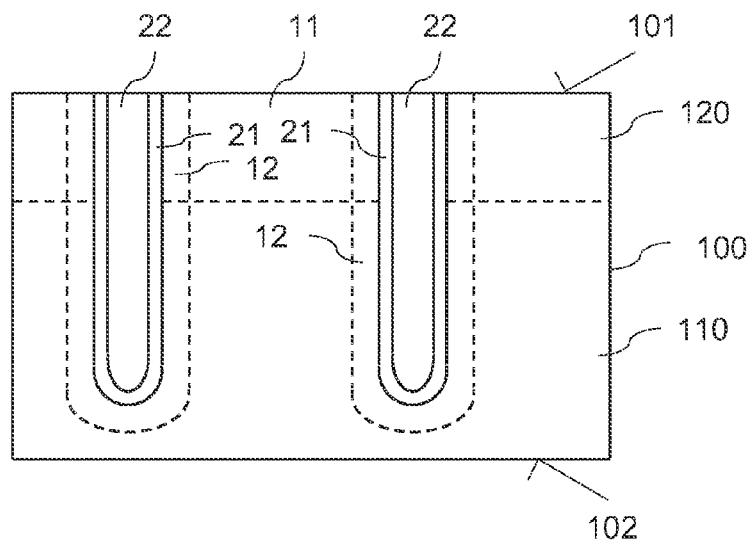
Figure 6:
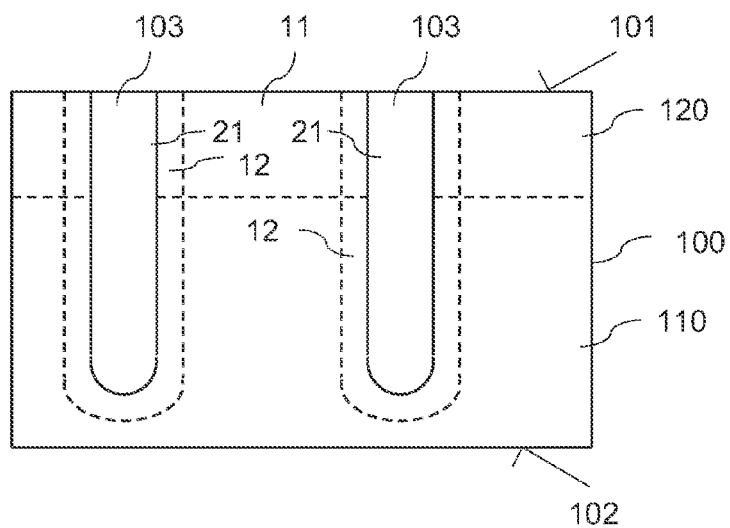
FIG. 6 illustrates a vertical cross section through the semiconductor component after process steps of a method according to a further embodiment.

In the embodiment illustrated in FIG. 1C the insulation layer 21 is produced along the sidewalls and the bottom of the insulation trench 103 such that a residual trench remains after the insulation layer 21 has been produced. Referring to FIG. 1D, this residual trench is filled with a filling material 22. The filling material 22 is, for example, an electrically conductive material, like a doped amorphous or polycrystalline semiconductor material, such as polysilicon, a metal, silicide or carbon. According to a further embodiment, the filling material 22 is an insulating material, so that the insulation trench 21 is completely filled with an insulation material. According to a further embodiment, which is illustrated in FIG. 6, the insulation layer 21 is produced such that it completely fills the insulation trench 103, so that there is no residual trench after the insulation layer 21 has been produced. In further embodiments a void may be enclosed in the trench 103 if, e.g., the opening of the trench 103 is closed during deposition before the trench 103 has been completely filled.

The insulation and filling materials are typically also deposited on the first surface 101 (e.g. on the trench etch mask) and second surface 102, which is not shown in FIG. 1C. After trench filling, these layers can be removed from the first and second surfaces 101, 102.

Figure 1E:
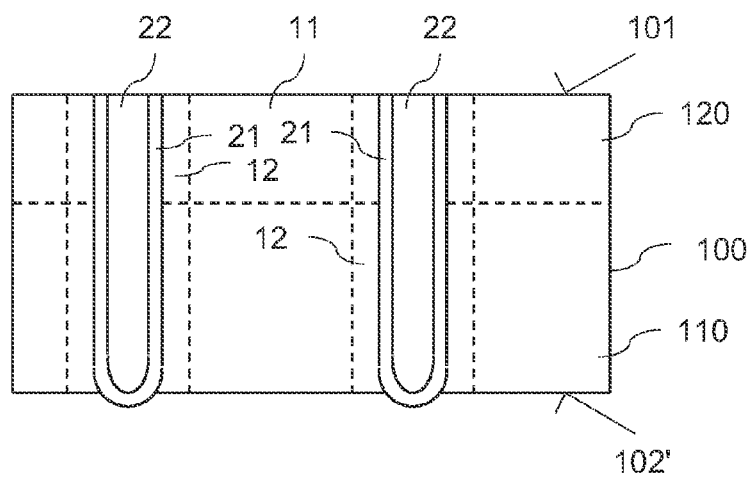

Referring to FIG. 1E, semiconductor material is removed from the second surface 102, so that a thickness—which corresponds to a vertical dimension of the semiconductor body 100—is reduced. For example, the removal of the semiconductor material at the second surface 102 includes at least one of an etching process, a mechanical polishing process, or a chemical-mechanical polishing (CMP) process. In FIG. 1E, reference character 102' denotes the second surface of the semiconductor body 100 after the removal process. It should be mentioned that the semiconductor body is usually flipped or turned upside after having finished processing the first surface and before processing the second surface. However, for a better understanding such flipping of the semiconductor body 100 is not illustrated.

Referring to the embodiment illustrated in FIG. 1E, the removal process can be performed such that at the end of the removal process the first insulation layer 21 is uncovered at the second surface 102'. In the embodiment illustrated, the semiconductor material is removed down to below the bottom of the insulation trench 103, so that at the end of the removal process the first insulation layer 21 at the bottom of the insulation trench is uncovered at the second surfaces and protrudes from the second surface 102'. Thus, the second surface is not planarized in this method.

Figure 1F:
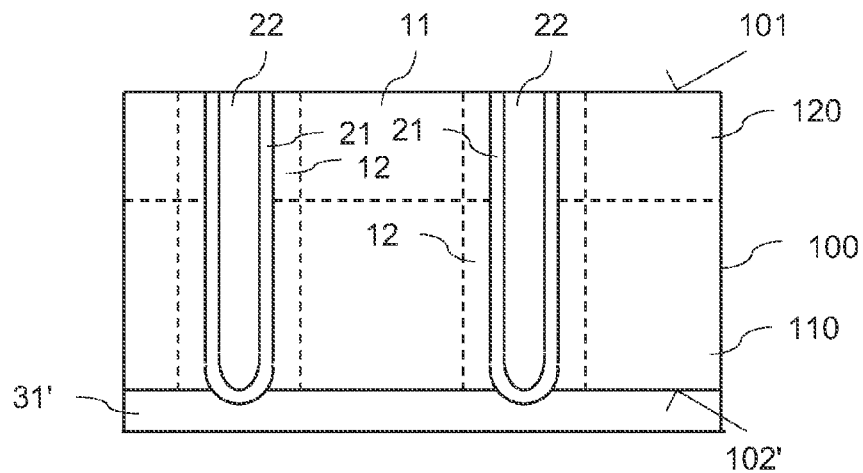
Figure 1G:
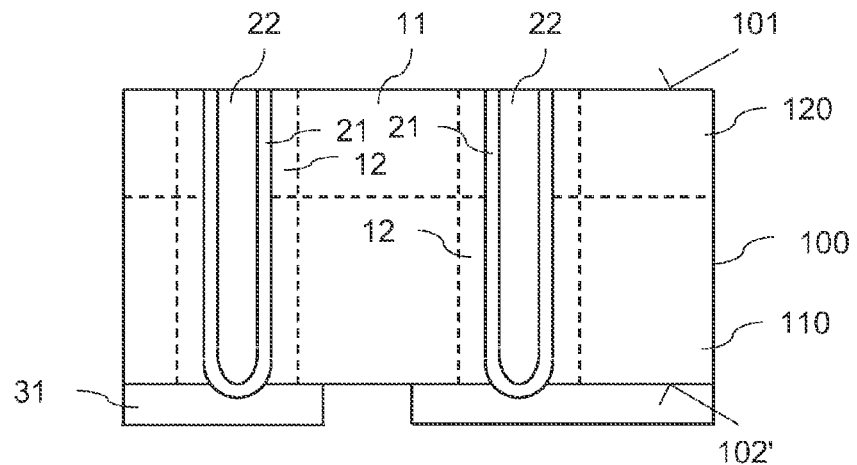

In next method steps, a second insulation layer 31 is formed on the second surface 102', with the second insulation layer 31 covering the uncovered region of the first insulation layer 21. Referring to FIGS. 1F and 1G, producing the second insulation layer 31 includes, for example, forming an insulation layer 31' which completely covers the second surface 102' (see FIG. 1F) and forming a contact opening in the insulation layer 31', with the contact opening extending to the via region 11. The contact opening is produced such that remaining sections 31 of the insulation layer 31' form the second insulation layer 31 which covers the at least one insulation trench 103 with the first insulation layer 21 at the second surface 102'. The second insulation layer 31 is, for example, an oxide layer or a nitride layer. The second layer 31 includes, in particular, a material which does not require high temperatures, like temperatures below 400° C., in the deposition process. Further suitable materials are, e.g., a spin-on glass or an imide. Before removing semiconductor material at the second surface 102, the device structures at and below the first surface can be finished or finally processed. This may include the deposition of metallization layers (not shown) on the first surface 101. Such metallization layers, however, cannot withstand high temperatures, like temperatures above 400° C.

Forming the second insulation layer 31 is optional. The insulation layer 21 at the bottom of the trenches can be sufficient to insulate the via region from surrounding semiconductor regions at the bottom of the trench.

For forming the second insulation layer 31, which adjoins the first insulation layer 21, it is not necessary to uncover the first insulation layer 21 in the removal process illustrated in FIG. 1E. According to an alternative embodiment, the semiconductor material is not removed down to the first insulation layer 21, but a (thin) layer of semiconductor material having a thickness of less than 1 µm remains below the first insulation layer 21 in the region of the second surface 102'. This is illustrated in dotted lines in FIG. 1E. In this case, forming the insulation layer 31' (see FIG. 1F) involves a process which transforms the semiconductor layer between the second surface 102' and the first insulation layer 21 into an insulation layer. Such a process is, for example, an oxidation process, like an anodic oxidation process, and/or a process in which oxygen is implanted into the semiconductor body 100 via the second surface 102'.

After the process steps illustrated in FIGS. 1E to 1G, the semiconductor via region 11 in a horizontal direction is completely enclosed by the insulation trench with the first insulation layer 21 and by the second insulation layer 31. The semiconductor via region 21 forms an electrically conductive connection between the first surface 101 and the second surface 102' of the semiconductor body 100, and is electrically insulated from other regions of the semiconductor body 100.

Figure 1H:
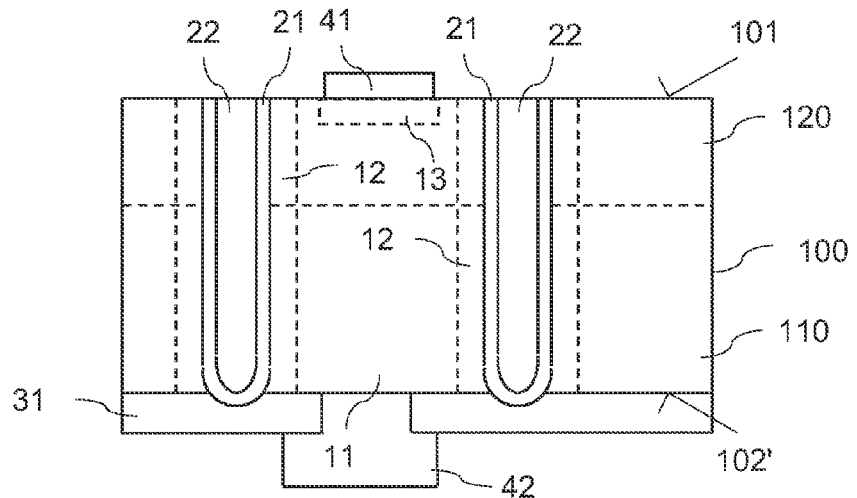

Referring to FIG. 1H a first contact electrode 41 is formed on the semiconductor via region 11 in the region of the first surface 101 and a second contact electrode 42 is formed on the semiconductor via region 11 in the region of the second surface 102'. To form the first and second contact electrodes 41, 42 in the region of the first and second surfaces 101, 102, respectively, means that these electrodes 41, 42 can be formed on the respective surfaces 101, 102. However one or both of these trenches could also be formed in trenches, wherein each of theses trenches extends from one of the surfaces 101, 102 into the via region and includes one of the first and second electrodes 41, 42 contacting the via region within the respective trench.

The first contact electrode 41 is, for example, a metal, a silicide, or a highly doped polycrystalline semiconductor material, such as polysilicon. Optionally, a doped contact region 13 is formed in the via region 11 below the first surface 101 before forming the first contact electrode 41. Such contact region can also be formed below the second surface 102' before forming the second contact electrode 42. However, such contact region can be omitted, when the semiconductor body has a high basic doping, like in the region of the higher doped first semiconductor layer 110.

Although the method steps for producing the semiconductor via 11 with the first and second contact electrodes 41, 42 have been illustrated in a certain order, the method is not restricted to perform theses steps in any particular order. Rather, the order of method steps can be changed. For example, the first contact electrode 41 on the first surface 101 and the optional contact region 13 can be produced before the removal process, or even before producing the insulation trench 103.

Figure 5A:
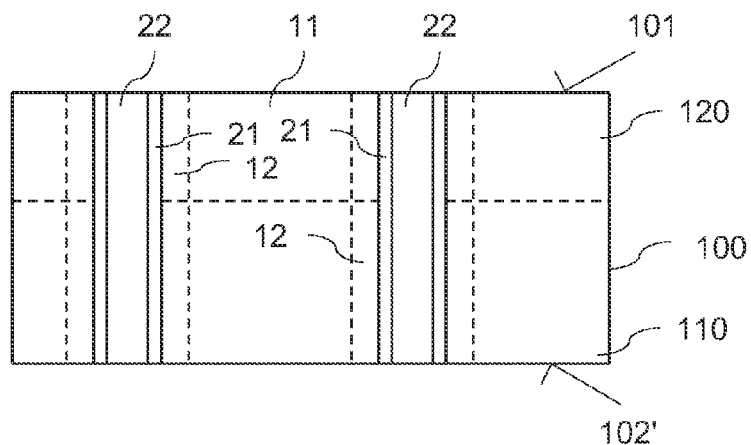
FIGS. 5A to 5C, illustrates vertical cross sections through a semiconductor body during method steps of a method according to a second embodiment.
Figure 5B:
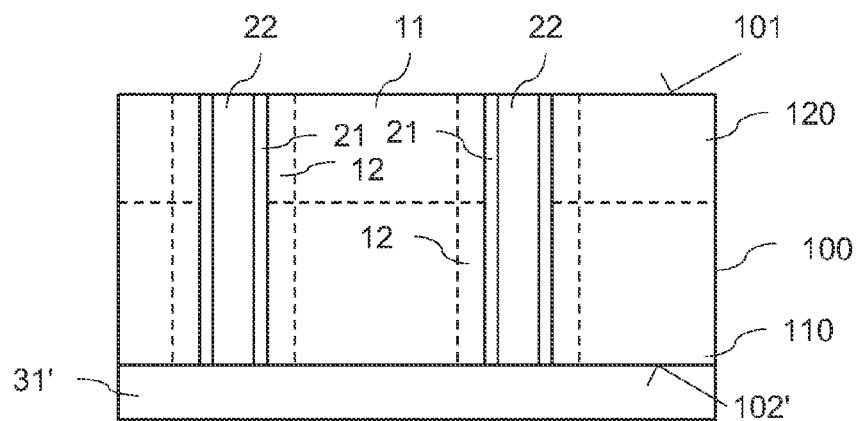
Figure 5C:
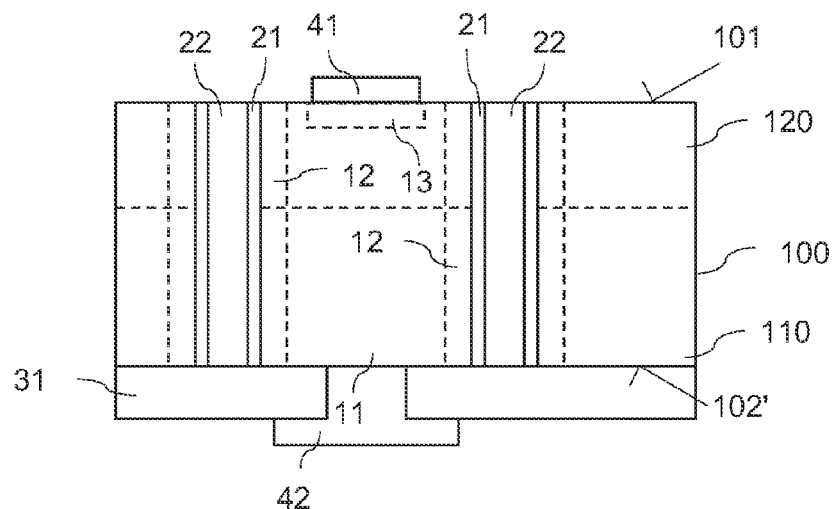

FIGS. 5A to 5C illustrate a further embodiment for producing a semiconductor via 11 in a semiconductor body 100. This method is basically equivalent to the method illustrated in FIGS. 1A to 1H with the difference that the second surface 102' is planarized at the end of or during the removal process so that the first insulation layer 21 in the bottom region of the insulation trench 103 is removed. FIG. 5A illustrates a vertical cross-section through the semiconductor body 100 after these method steps. After these method steps the first insulation layer 21 is present on opposite sidewalls of the insulation trench 103 and a filling material 22 is uncovered at the second surface 102'. Referring to the explanation provided herein above, the filling material 22 is optional. As such, the insulation trench 103 can be completely filled with the first insulation layer 21.

The method steps illustrated in FIGS. 5B and 5C for forming the second insulation layer 31 on the second surface 102', and for forming the first and second contact electrodes 41, 42 correspond to the method steps illustrated in FIGS. 1F to 1H to which reference is made, respectively. The second insulation layer 31 covers the insulation trench 103 at the second surface 102' and leaves a contact opening above the semiconductor via region 11.

Referring to the explanation provided hereinabove, the first insulation trench 103 can be filled completely with the first insulation layer 21, where the first insulation layer 21 may also be produced as a stack of different material layers and may contain voids. A vertical cross-section through the semiconductor body 100 having the insulation trench 103 filled completely with the first insulation layer 21 is illustrated in FIG. 6. FIG. 6 shows a vertical cross section through the semiconductor body 100 before removing semiconductor material from the second surface 102 and before producing the first and second contact electrodes 41, 42.

The ohmic resistance of the semiconductor via region 11 between the first and second contact electrodes 41, 42 is, amongst others, dependent on the length of the via region 11, with the length corresponding to the vertical thickness of the semiconductor body 100, the area of the horizontal cross-section of the semiconductor via region 11, and the doping concentration of the via region 11. The ohmic resistance of the semiconductor via region 11 can be reduced by providing the higher doped regions 12 along the sidewalls of the insulation trench 103.

According to a further embodiment, the ohmic resistance of the semiconductor via region 11 can be reduced by additionally providing a contact trench filled with an electrically conductive material within the semiconductor via region 11. Such contact trench can be provided optionally or additionally to the higher doped semiconductor region 12. An embodiment of a method for producing a semiconductor via region 11 with a contact trench is explained next with reference to FIGS. 7A to 7E. These figures each show a vertical cross section through the semiconductor body 100 during particular steps of the method. Although these method steps are illustrated in a certain order in the figures, this order can be changed.

Figure 7A:
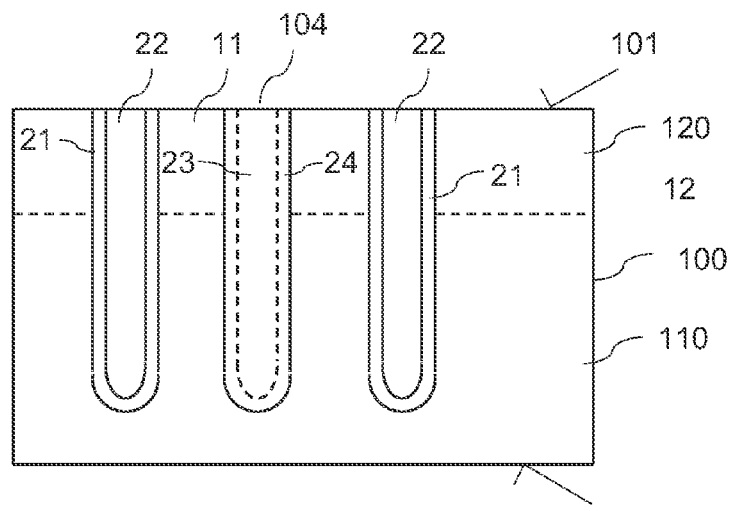
FIGS. 7A to 7E illustrates vertical cross sections through a semiconductor body during method steps of a method which, besides a semiconductor via, produces a further via in the semiconductor via region.
Figure 7B:
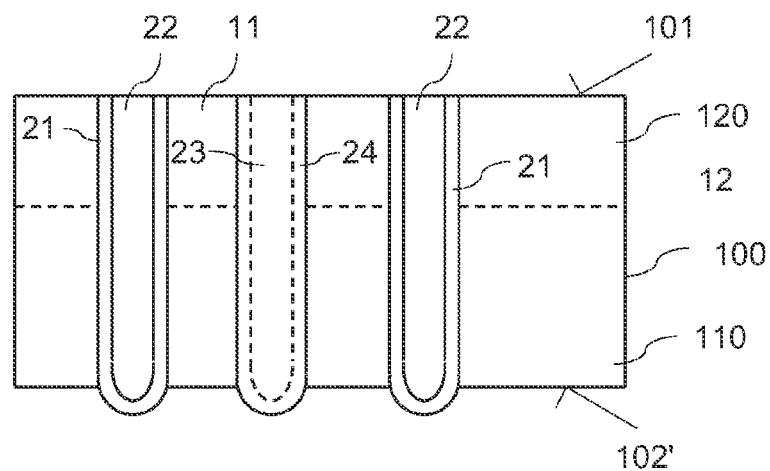
Figure 7C:
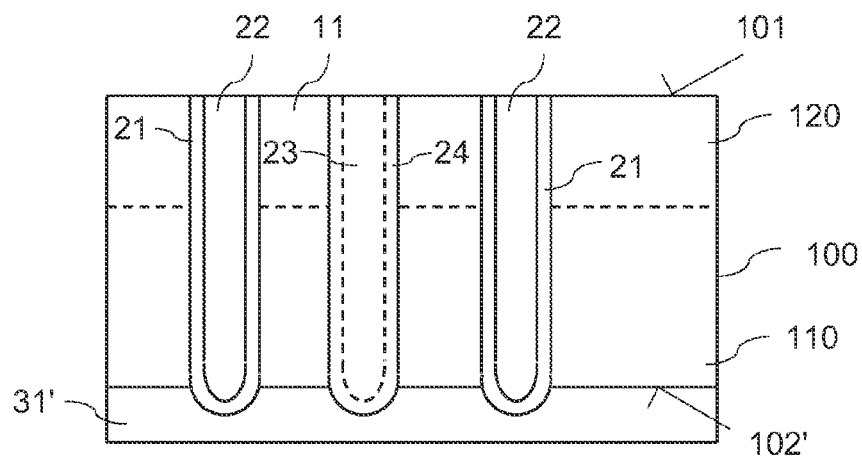
Figure 7D:
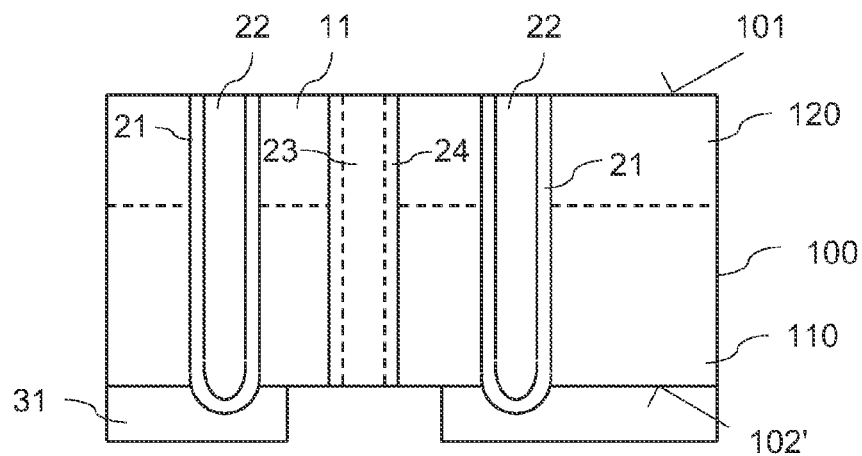

Referring to FIG. 7A this method involves, besides forming the insulation trench 103 and filling the insulation trench 103, forming a contact trench 104 which extends from the first surface 101 into the semiconductor body, and filling the contact trench 104 with an electrically conductive material 23. The electrically conductive material 23 is, for example, a doped amorphous or polycrystalline semiconductor material, such as polysilicon, a metal, a silicide, or carbon. According to one embodiment, the contact trench 104 is filled with a layer stack which includes at least two different electrically conductive layers. Optionally a diffusion barrier or a third insulation layer 24 is formed along the sidewalls of the contact trench 104 before filling the trench 104 with the electrically conductive material 23. The electrically conductive material 23 forms a conductive via within the semiconductor via region 11. The contact trench 104 can be produced such that it is arranged distant to the insulation trench 103. The position of the contact trench 104 within the semiconductor via region 11 is illustrated in dashed lines in the embodiments illustrated in FIGS. 2, 3 and 4.

The insulation trenches can include the first insulation layer 21 and an electrically conductive filling material 22, as illustrated in FIG. 7A. Alternatively, the insulation trench 103 can be completely filled with the first insulation layer 21 as illustrated in FIG. 6.

Figure 7E:
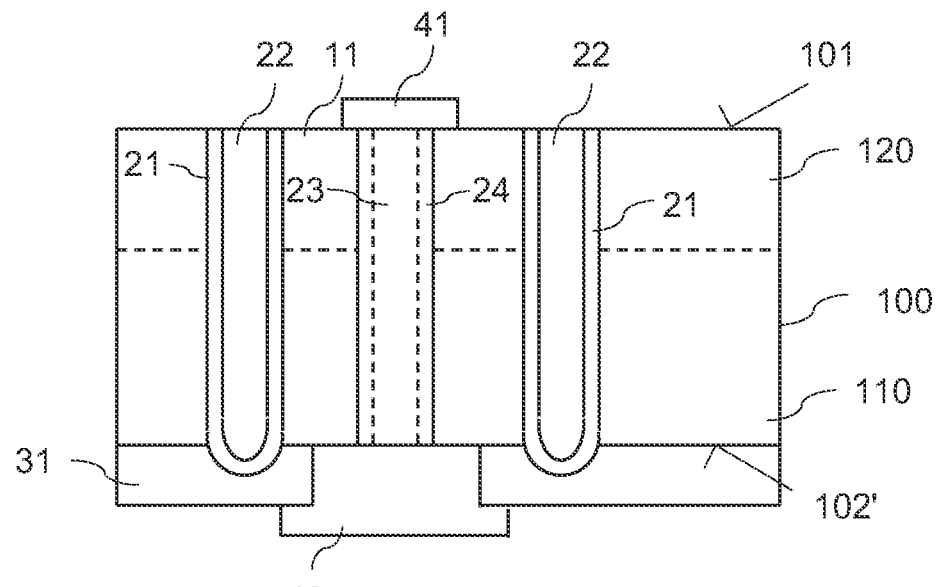

The remaining method steps illustrated in FIGS. 7B to 7E correspond to the method steps illustrated in FIGS. 1E to 1H, respectively. These method steps include partially removing the semiconductor body 100 at the second surface 102 (see FIG. 7B), forming the second insulation layer 31 adjacent to the first insulation layer 21 (see FIGS. 7C and 7D). The contact opening in the insulation layer 31' is formed such that the contact opening uncovers the contact via 23 at the second surface 102'. Referring to FIG. 7E, the first and second contact electrodes 41, 42 are formed on the contact via 23 and the semiconductor via 11 on the first surface 101 and on the second surface 102, respectively.

Forming the insulation trench 103 and the contact trench 104 may include common method steps. According to one embodiment these trenches 103, 104 are etched by the same etching process. Further, when the filling material 22 of the insulation trenches 103 is an electrically conductive material, the filling material 22 in the insulation trenches 103 and the electrically conductive material 23 in the contact trench 104 can be produced by the same method steps.

In the method illustrated in FIGS. 7A to 7E, the first insulation layer 21 at the bottom of the insulation trench 103 is preserved during the process of partially removing the semiconductor body 100 at the second surface 102. This is in correspondence with the method illustrated in FIGS. 1A to 1H.

According to one embodiment, the contact trench 104 is produced to extend deeper into the semiconductor body 100 from the first surface 101 than the insulation trenches 103. A deeper contact trench 104 can be produced using the same process that produces the insulation trenches 103 when the contact trench 104 is wider than the insulation trenches 103. After the contact trench 104 is filled with the electrically conductive material 23, and when the semiconductor material is removed from the second surface 102, the contact electrode 23 in the (deeper) contact trench 104 is uncovered before the insulation trenches 103 are reached. This allows to uncover the contact electrode 23 at the second surface 102' without removing the insulation layer 21 at the bottom of the insulation trenches 103.

Figure 8:
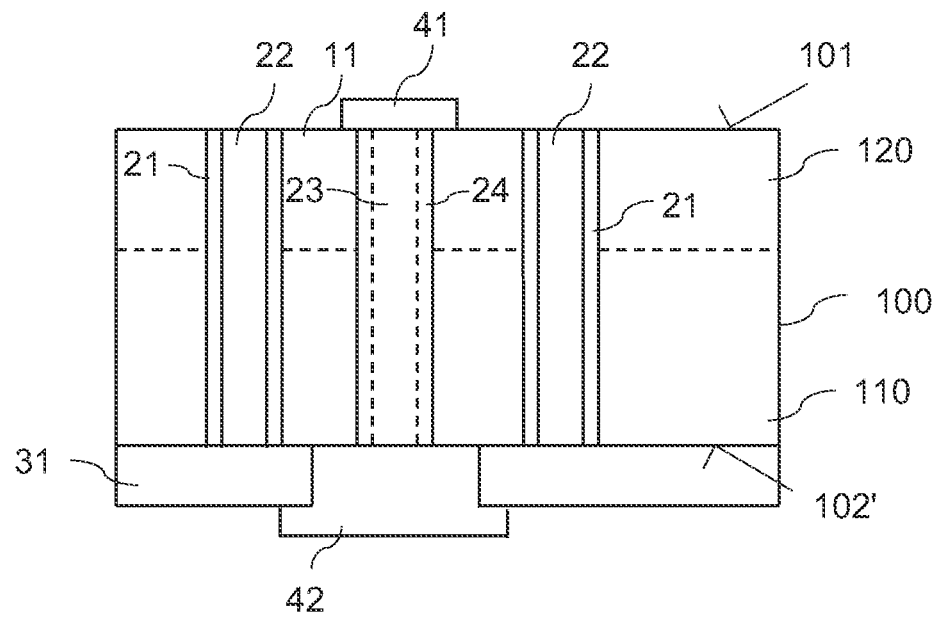
FIG. 8 illustrates a vertical cross section through a semiconductor component produced in accordance with a modification of the method according to FIG. 7.

However, similarly to the method illustrated in FIGS. 5A to 5C, the first insulation layer 21 can be partially removed at the bottom of the insulation trench 103 during the removal process, so that the filling material 22 is uncovered at the bottom of the trench 103, if there is a filling material 22 besides the first insulation layer 22. A semiconductor component produced in accordance with this modification is illustrated in FIG. 8.

Figure 9:
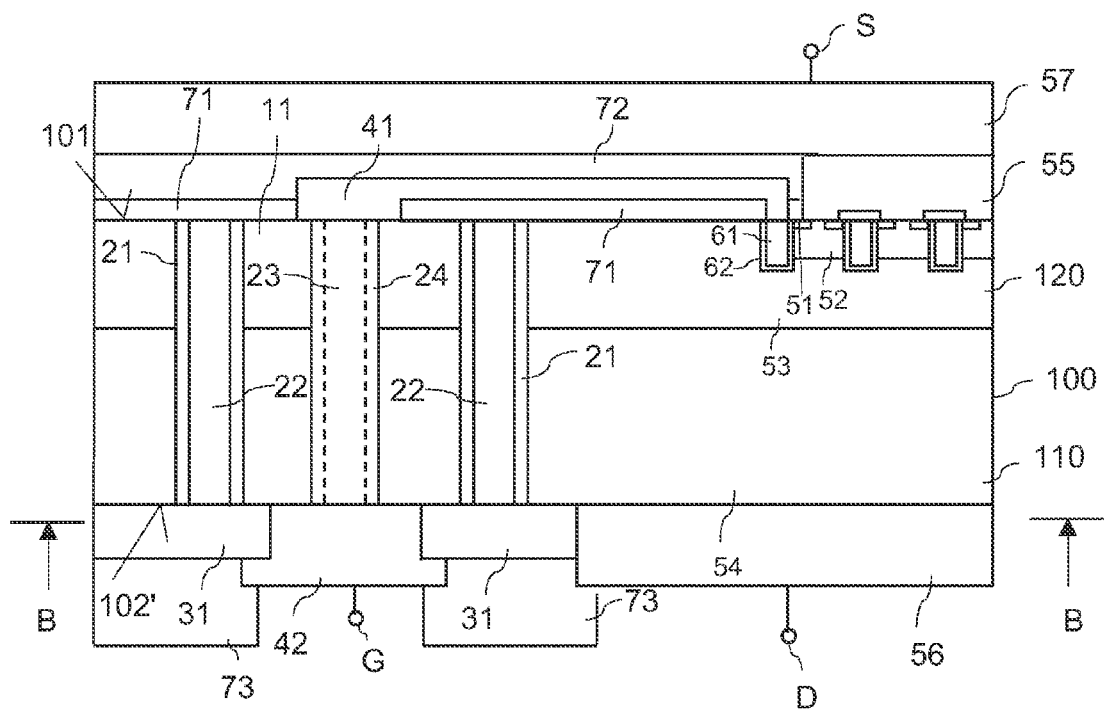
FIG. 9 illustrates a vertical cross section through a transistor component which includes a semiconductor via.

The semiconductor via region 11 and the optional contact via 23 can be used to connect any type of component region or device structure which is arranged in the region of the first surface 101 of the semiconductor body 100 with the second contact electrode 42 at the second surface 102'. FIG. 9 illustrates a vertical cross-section through a transistor, specifically a vertical MOS transistor. The MOS transistor is implemented in a semiconductor body 100 which includes a highly doped first semiconductor layer 110 and a lower doped second semiconductor layer 120. The MOS transistor includes a drain region 54 which is implemented by the first semiconductor layer 110 and which is contacted by a drain electrode 56 arranged on the second surface 102'. The drain electrode 56 forms a drain terminal D of the MOS transistor. The MOS transistor further includes a drift region 53 adjacent the drain region 54. The drift region 53 is formed by those sections of the first semiconductor layer 120 which have a basic doping of the second layer 120. The transistor further includes at least one transistor cell with a source region 51, a body region 52 arranged between the source region 52 and the drift region 53, and a gate electrode 61 arranged adjacent the body region 52 and dielectrically insulated from the body region 52 by a gate dielectric 62.

In FIG. 9, several transistor cells with a source region 51 and a body region 52 are illustrated. In the embodiment illustrated in FIG. 9, the gate electrode 61 is implemented as a trench-gate-electrode, which is a gate electrode arranged in a trench and extending from the first surface 101 into the semiconductor body 100. Implementing the gate electrode 61 as a trench-electrode, however, is only an example. The gate electrode 61 could also be implemented as a planar electrode, which is an electrode arranged above the first surface 101 of the semiconductor body 100. In FIG. 9, different sections of the gate electrode 61 are shown. These sections of the gate electrode 61 are electrically connected with each other in a manner not illustrated. For example, the gate electrode 61 has a grid-shaped geometry in the horizontal plane. Or, the individual sections 61 illustrated in FIG. 9 in a direction perpendicular to the section plane illustrated in FIG. 9 are longitudinal electrode sections. These longitudinal gate electrode sections can be electrically connected with each other by a connection arranged in a trench (not shown) which extends perpendicular to the gate electrode sections 61.

The gate electrode 61 is electrically connected to the first contact electrode 41, with the first contact electrode 41 dielectrically insulated by an insulation layer 71 from regions of the semiconductor body 100 which are outside the via region 11, and optionally from the trench filling material 22. Via the contact electrode 41 and the semiconductor via 11 the gate electrode 61 is electrically connected to the second contact electrode 42 arranged on the second surface 102'.

Thus, a gate terminal G of the MOS-transistor is formed by the second contact electrode 42 arranged on the second surface 102' of the semiconductor body. The individual source regions 51 and the body regions 52 are electrically connected to a source electrode 55 which is dielectrically insulated from the gate electrode 61. The source electrode 55 is arranged on top of the first surface 101 of the semiconductor body. This vertical MOS transistor has its source electrode 55 above the first surface 101, and has its gate electrode 42 and its drain electrode 56 arranged on the second surface 102' of the semiconductor body.

The source electrode 55 is electrically connected to an electrode layer 57, like a metallization layer, which is arranged above the source electrode 55 and the gate contact electrode 41 and which is dielectrically insulated from the gate contact electrode 41 by a further dielectric layer 72. The electrode layer 57 forms an outer source electrode which, by virtue of its planar surface, can be mounted to a leadframe (not shown).

Alternatively a single layer metallization with a predominantly flat surface can be used and the gate contact electrode 41 can be made from a different material like highly doped polysilicon.

In this connection it should be mentioned that before producing the gate electrode 42 and the drain electrode 56 on the second surface 102' contact implantations can be made, which are implantations which serve to reduce the ohmic resistance between the via region 11 and the gate electrode 42 and between the drain region 54 and the drain electrode 56.

In the embodiment illustrated in FIG. 9, the drain region 54 is formed by a highly doped semiconductor layer 110, like a substrate, on which a lower doped layer 120, like an epitaxial layer, in which the drift region 53 is implemented is arranged. According to a further embodiment, the semiconductor body 100 has a basic doping which corresponds to the doping of the drift region 53. In this case, the drain region 54—and an optional field stop region in an IGBT—are formed by an implantation and/or diffusion and/or annealing process before producing the drain electrode 56. In this case, the vertical thickness of the semiconductor body 100 defines the length of the drift region 53.

Referring to FIG. 9, a passivation layer 73 can be formed on the second surface 102' or on the second insulation layer 31 (if a second insulation layer has been produced). The passivation layer 73 has contact openings above the gate electrode 41 and the drain electrode 56. As such, the gate electrode 42 and the drain electrode can be produced with the same method steps or can be part of one structured metallization layer.

The MOS transistor can be implemented as an n-type transistor or a p-type transistor. In an n-type transistor the source region 51 and the drift region 53 are n-doped, while the body region 52 region is p-doped. In a p-type transistor the source region 51 and the drift region 53 are p-doped, while the body region 52 is n-doped. The MOS-transistor can be implemented as a MOSFET or as an IGBT. In a MOSFET the drain region 54 has the same doping type as the source region 51, and in an IGBT the drain region 54 (which is also referred to as collector region) has a doping type which is complementary to the doping type of the source region 51.

The second contact electrode or gate electrode 42 and the drain electrode 56 can be arranged in many different ways on the second surface 102' of the semiconductor body 100. Three different embodiments are explained next with reference to FIGS. 10 to 12 each of which shows a horizontal cross-section through the second contact electrode 42 and the drain electrode 56 in a horizontal section plane B-B illustrated in FIG. 9.

Figure 10:
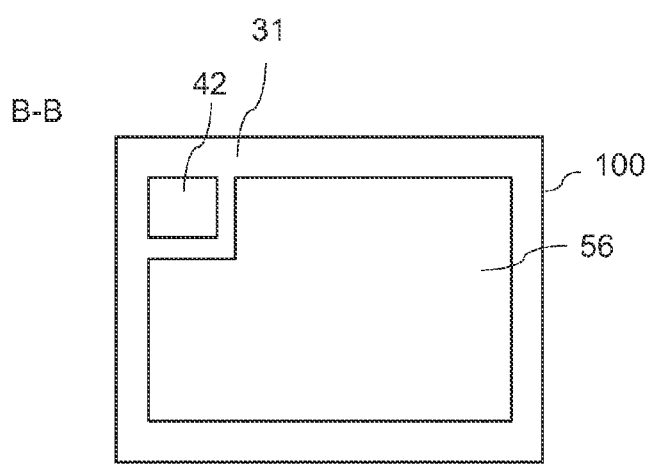
FIG. 10 illustrates a top view on one surface of a transistor component according to a first embodiment.

In the embodiment illustrated in FIG. 10, the drain electrode 56 and the gate electrode 52 are arranged next to each other, with the drain region 56 having a cut-out region in which the gate electrode 42 is arranged. The drain electrode 56 and the gate electrode 42 are electrically insulated from one another by the second insulation layer 31 and/or insulation layer 21.

Figure 11:
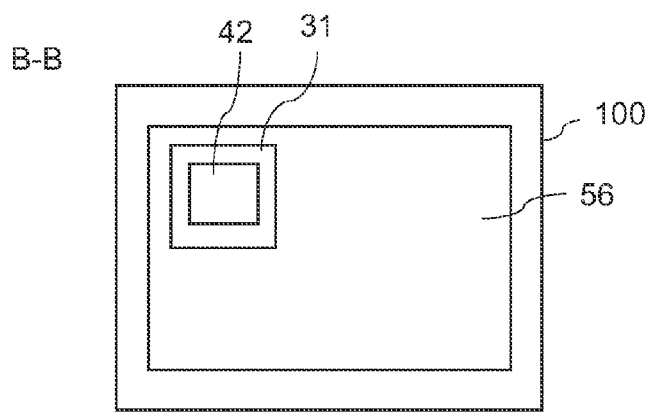
FIG. 11 illustrates a top view on one surface of a transistor component according to a second embodiment.

In the embodiment illustrated in FIG. 11, the gate electrode 42 is surrounded by the drain electrode 56, with the gate electrode 42 and the drain electrode 56 being electrically insulated from one another by the second insulation layer 31.

Figure 12:
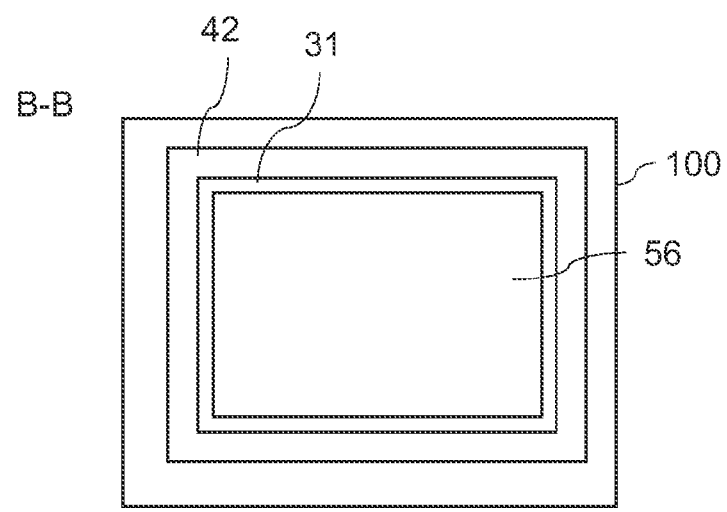
FIG. 12 illustrates a top view on one surface of a transistor component according to a third embodiment.

In the embodiment illustrated in FIG. 12, the gate electrode 42 surrounds the drain electrode 56, with these two electrodes 42, 56 being electrically insulated from one another by the second insulation layer 31 and/or insulation layer 21. In the embodiment according to FIG. 12 the gate electrode 42, like the semiconductor via region 11, has a ring-shaped geometry.

In other embodiments gate electrode 42 and via region 11 have different shapes. The drain electrode 56 can overlap with the via region 11. This requires however an insulation region between the gate electrode 42 and the drain regions as well as between the drain electrode 56 and the via region 11.

Figure 13:
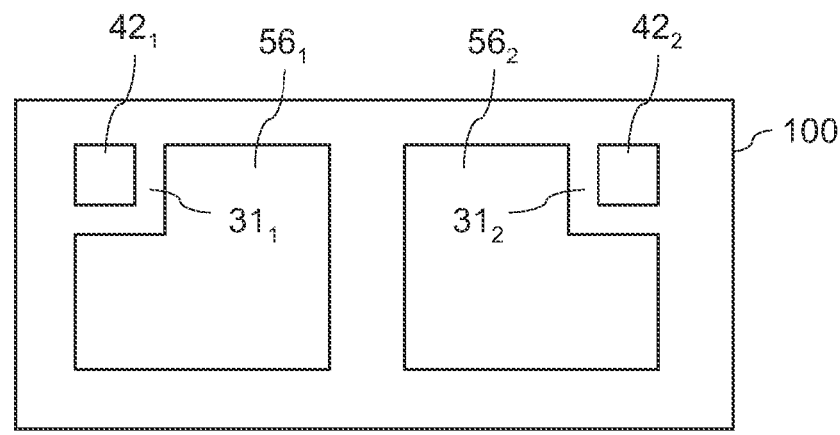
FIG. 13 illustrates a top view on one surface of a semiconductor body in which two transistor components, each including a semiconductor via, are integrated.
Figure 14:
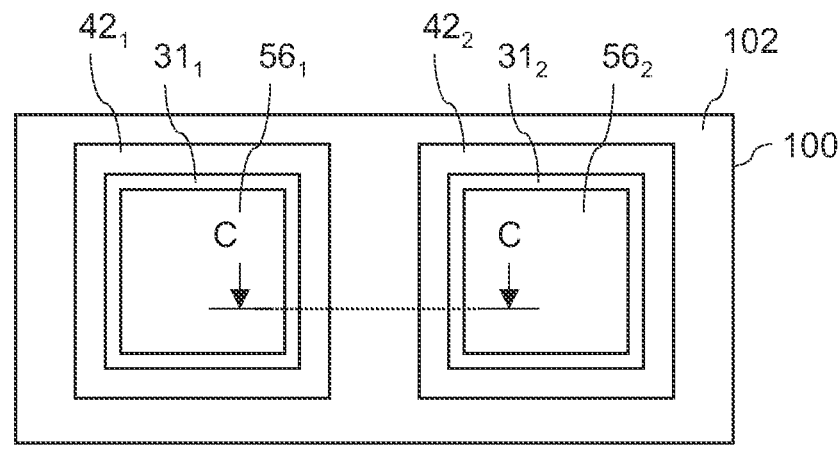
FIG. 14 illustrates a second embodiment of a semiconductor arrangement in which two transistor components, each including a semiconductor via, are integrated.

Two MOS-transistors can be implemented in a single semiconductor body. FIGS. 13 and 14 show horizontal cross-sections through gate electrodes and drain electrodes of two MOS-transistors implemented in one semiconductor body 100. In the embodiment illustrated in FIG. 13, a first gate electrode 42$_1$ and a first drain electrode 56$_1$ of a first MOS transistor are arranged next to each other and electrically insulated from one another by a second insulation layer 31$_1$. Further, a second gate electrode 42$_2$ and a second drain electrode 56$_2$ of a second MOS transistor are arranged next to each other and electrically insulated from one another by a second insulation layer 31$_2$. In addition one or more insulation trenches 103 can be provided between the drain electrodes 56$_1$ and 56$_2$ or surrounding one or both MOS-transistors to laterally insulate the drain and source potentials from one another. The source regions can be connected to a common source electrode or to electrically insulated source electrodes. Thus common source or common drain devices can be realized.

In the embodiment illustrated in FIG. 14, a first drain electrode 56$_1$ is surrounded by a first gate electrode 42$_1$ and a second drain electrode 56$_2$ surrounded by a second gate electrode 42$_2$, with the first and second gate electrodes 42$_1$, 42$_2$ being arranged distant from one another in a horizontal direction of the semiconductor body.

Figure 15:
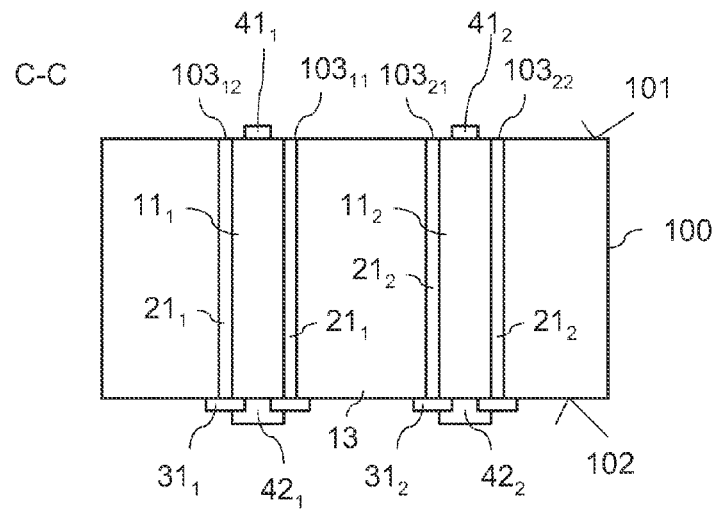
FIG. 15 illustrates a vertical cross-section through the component according to FIG. 14 in a section plane C-C.

FIG. 15 illustrates a vertical cross-section through the semiconductor body 100 of FIG. 14 in a vertical section plane C-C. In this vertical cross-section section of the first and second gate electrodes 42$_1$, 42$_2$, of the corresponding first contact electrodes 42$_1$, 42$_2$, and the semiconductor via regions 11$_1$, 11$_2$ are shown. Reference numerals 21$_1$ and 21$_2$ denote respective first insulation layers. In the embodiment illustrated in FIG. 15 the insulation trenches are completely filled with the first insulation layers 21$_1$, 21$_2$. However, this is only an example. These insulation trenches could also be implemented to be filled with the first insulation layer and a filling material e.g. as shown in FIG. 1D.

The first and second semiconductor vias 11$_1$, 11$_2$ illustrated in FIG. 15 are each produced (defined) by two insulation trenches 103$_{11}$, 103$_{12}$ and 103$_{21}$, 103$_{22}$, respectively. In a horizontal direction the first and second vias 11$_1$, 11$_2$ are separated from one another by two first insulation layers 21$_1$, 21$_2$ and a semiconductor region 13 arranged between the two first insulation layers 21$_1$, 21$_2$.

Figure 16:
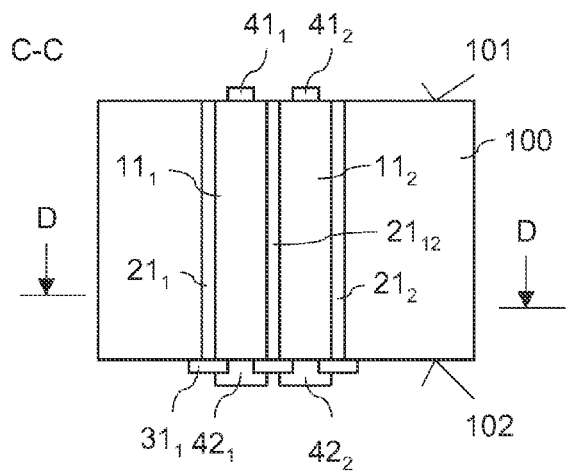
FIG. 16 illustrates a part of a vertical cross-section through a semiconductor body in which two transistor components are integrated.
Figure 17:
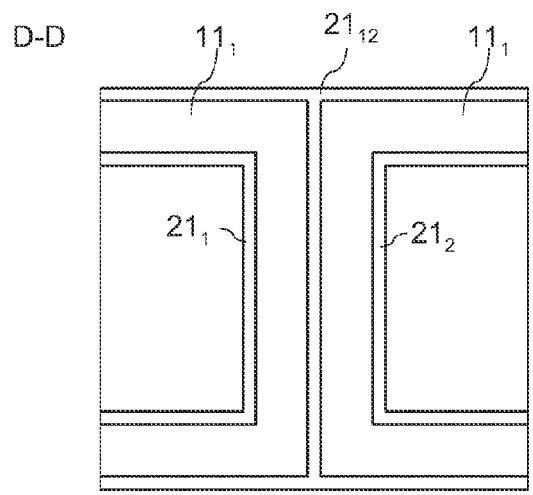
FIG. 17 illustrates a horizontal cross-section through the arrangement of FIG. 16.

FIG. 16 illustrates a further embodiment, in which the two semiconductor via regions 11$_1$, 11$_2$ are only separated by one insulation trench with a first insulation layer 21$_{12}$. In this embodiment, the insulation trench between the semiconductor vias 11$_1$, 11$_2$ is completely filled with the insulation layer 21$_{12}$. However, this is only an example, this insulation trench could also be filled with the first insulation layer 21$_{12}$ and an additional filling material e.g. as shown in FIG. 1D. FIG. 17 illustrates a horizontal cross-section through the arrangement according to FIG. 16 in a horizontal section plane D-D.

Figure 18:
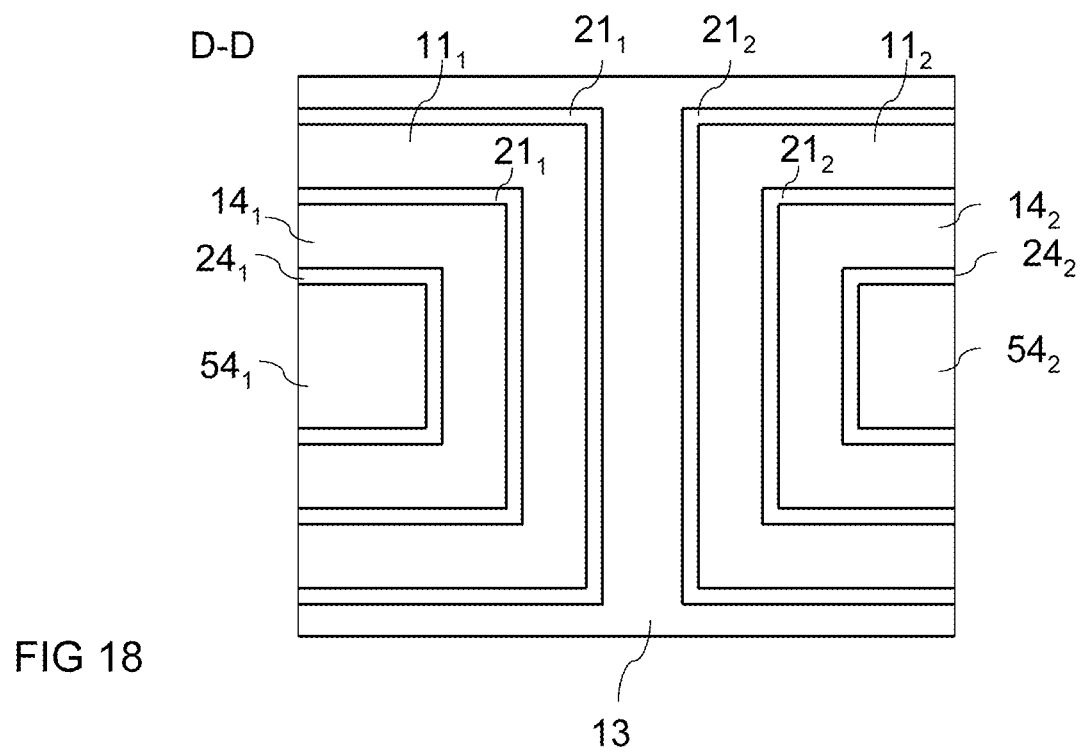
FIG. 18 illustrates a horizontal cross-section through a semiconductor body according to a further embodiment in which two transistor components are integrated.

FIG. 18 illustrates a further embodiment of a transistor arrangement with two MOS-transistors integrated in a semiconductor body 100. FIG. 18 illustrates a horizontal cross-section in a horizontal section plane through the gate electrode and the drain electrode. In this embodiment between the semiconductor via regions 11$_1$ and 11$_2$ a semiconductor region 13 is arranged, and between the semiconductor via regions 11$_1$, 11$_2$ and the drain electrodes or drain regions 54$_1$, 54$_2$ additional semiconductor regions 14$_1$, 14$_2$ are arranged, with the additional semiconductor regions 14$_1$, 14$_2$ being insulated from the drain regions 54$_1$, 54$_2$ by additional insulation trenches formed in correspondence with the insulation trenches 103$_1$, 103$_2$. These additional insulation trenches are filled with additional insulation layers 24$_1$, 24$_2$. Optionally, these additional insulation trenches are filled with the additional insulation layers 24$_1$, 24$_2$ and a filling material, like the insulation trenches 103 illustrated in FIG. 1D. In this embodiment, the additional semiconductor regions 14$_1$, 14$_2$ separate the via regions 11$_1$, 11$_2$ from the drain regions.

According to one embodiment, the semiconductor region 13 and the semiconductor regions 14 are connected to terminals for a defined electrical potential, such as ground or source potential, wherein source potential is the electrical potential of the source electrode 55. Thereby the capacitive coupling between the gates of the two transistors or between gate and drain of one transistor is significantly reduced.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component, wherein the semiconductor component is implemented as an MOS transistor, the semiconductor component comprising:
    a semiconductor body with a first surface and a second surface;
    a first contact electrode in a region of the first surface;
    a second contact electrode in a region of the second surface;
    a first insulation layer defining a via region in a horizontal direction of the semiconductor body;
    a monocrystalline semiconductor region arranged in the via region and extending between the first contact electrode and the second contact electrode;
    a gate electrode electrically connected to the first contact electrode in the region of the first surface;
    a source region arranged below the first surface;
    a source electrode electrically connected to the source region, electrically insulated from the gate electrode, and arranged at least partially above the first surface; and
    a drain electrode electrically insulated from the second contact electrode on the second surface,
    wherein the MOS transistor comprises a gate terminal formed by the second contact electrode arranged on the second surface, wherein the gate terminal is electrically connected to a gate-electrode of the MOS transistor through the via region, and wherein the gate-electrode is formed next to the first surface and disposed outside of the via region.

2. The semiconductor component of claim 1, wherein the first insulation layer forms a closed loop in a horizontal plane parallel to the first surface of the semiconductor body, and wherein the closed loop encloses the via region.

3. The semiconductor component of claim 2, wherein the closed loop has a rectangular or ellipsoidal geometry in the horizontal plane.

4. The semiconductor component of claim 1, wherein the first insulation layer together with an edge of the semiconductor body forms a closed loop in a horizontal plane of the semiconductor body parallel to the first surface, and wherein the closed loop encloses the via region.

5. The semiconductor component of claim 1, further comprising a second insulation layer on the second surface which extends to the first insulation layer.

6. The semiconductor component of claim 5, wherein the second insulation layer comprises at least one of an oxide layer, a nitride layer, a spin-on glass, and an imide.

7. The semiconductor component of claim 1, wherein the first insulation layer comprises at least one of an oxide layer, a nitride layer and a low-k-dielectric.

8. The semiconductor component of claim 1, further comprising, in a vertical cross-section substantially orthogonal to the first surface, two insulation trenches extending between the first surface and the second surface, wherein the first insulation layer is formed on adjacent sidewalls of the two insulation trenches.

9. The semiconductor component of claim 8, wherein the two insulation trenches include an electrically conductive filling material.

10. The semiconductor component of claim 8, wherein each of the two insulation trenches forms a closed loop in a horizontal plane parallel to the first surface of the semiconductor body, and wherein the semiconductor via region is disposed between the two insulation trenches.

11. The semiconductor component of claim 1, further comprising at least one of a doped contact portion of the monocrystalline semiconductor region formed at the first surface, a doped contact portion of the monocrystalline semiconductor region formed at the second surface, and a doped portion of the monocrystalline semiconductor region formed at the first insulation layer.

12. The semiconductor component of claim 1, further comprising a contact trench in the via region which is at least partially filled with an electrically conductive material extending to the second surface.

13. The semiconductor component of claim 12, wherein a third insulation layer is formed along sidewalls of the contact trench.

14. The semiconductor component of claim 1, wherein the first insulation layer extends between the first surface and the second surface.

15. The semiconductor component of claim 1, wherein the gate-electrode is either arranged in a trench extending from the first surface or is arranged above the first surface.

16. A semiconductor component, wherein the semiconductor component is implemented as an MOS transistor, the semiconductor component comprising:
    a semiconductor body with a first surface and a second surface;
    a first contact electrode in a region of the first surface;
    a second contact electrode in a region of the second surface;

a first insulation layer defining a via region in a horizontal direction of the semiconductor body;
a monocrystalline semiconductor region arranged in the via region and extending between the first contact electrode and the second contact electrode;
a gate electrode electrically connected to the first contact electrode in the region of the first surface;
a source region arranged below the first surface;
a source electrode electrically connected to the source region, electrically insulated from the gate electrode, and arranged at least partially above the first surface;
a drain electrode electrically insulated from the second contact electrode on the second surface,
wherein the first insulation layer forms a closed loop in a horizontal plane parallel to the first surface of the semiconductor body, and wherein the closed loop encloses the via region.

17. A semiconductor component, wherein the semiconductor component is implemented as an MOS transistor, the semiconductor component comprising:
a semiconductor body with a first surface and a second surface;
a first contact electrode in a region of the first surface;
a second contact electrode in a region of the second surface;
a first insulation layer defining a via region in a horizontal direction of the semiconductor body;
a monocrystalline semiconductor region arranged in the via region and extending between the first contact electrode and the second contact electrode;
a gate electrode electrically connected to the first contact electrode in the region of the first surface;
a source region arranged below the first surface;
a source electrode electrically connected to the source region, electrically insulated from the gate electrode, and arranged at least partially above the first surface;
a drain electrode electrically insulated from the second contact electrode on the second surface,
wherein the first insulation layer together with an edge of the semiconductor body forms a closed loop in a horizontal plane of the semiconductor body parallel to the first surface, and wherein the closed loop encloses the via region.

\* \* \* \* \*